US012394501B2

(12) United States Patent
Tamano et al.

(10) Patent No.: US 12,394,501 B2
(45) Date of Patent: Aug. 19, 2025

(54) APPARATUS WITH ADJUSTABLE DIAGNOSTIC MECHANISM AND METHODS FOR OPERATING THE SAME

(71) Applicant: Micron Technology, Inc., Boise, ID (US)

(72) Inventors: Takuya Tamano, Boise, ID (US); Yoshinori Fujiwara, Boise, ID (US); Daniel S. Miller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 209 days.

(21) Appl. No.: 18/137,388

(22) Filed: Apr. 20, 2023

(65) Prior Publication Data

US 2024/0021262 A1 Jan. 18, 2024

Related U.S. Application Data

(60) Provisional application No. 63/389,463, filed on Jul. 15, 2022.

(51) Int. Cl.
*G11C 16/04* (2006.01)
*G11C 29/44* (2006.01)
*G11C 29/46* (2006.01)

(52) U.S. Cl.
CPC .......... *G11C 29/46* (2013.01); *G11C 29/4401* (2013.01)

(58) Field of Classification Search
CPC ............................ G11C 29/46; G11C 29/4401
See application file for complete search history.

(56) References Cited

U.S. PATENT DOCUMENTS 5,883,843 A * 3/1999 Hii ........................ G11C 29/36 714/724
6,658,611 B1 * 12/2003 Jun ........................ G11C 29/16 365/201
11,257,562 B2 * 2/2022 Tan ........................ G06F 11/27

* cited by examiner

*Primary Examiner* — Pho M Luu
(74) *Attorney, Agent, or Firm* — Dorsey & Whitney LLP

(57) ABSTRACT

Methods, apparatuses, and systems may implement adjusted circuit tests. A memory device may include a self-test circuit that is configured to selectively suspend collection and/or processing of test results for one or more portions of the self-test.

20 Claims, 4 Drawing Sheets

APPARATUS WITH ADJUSTABLE DIAGNOSTIC MECHANISM AND METHODS FOR OPERATING THE SAME

CROSS-REFERENCE TO RELATED APPLICATION(S)

The present application claims priority to U.S. Provisional Patent Application No. 63/389,463, filed Jul. 15, 2022, the disclosure of which is incorporated herein by reference in its entirety.

TECHNICAL FIELD

The disclosed embodiments relate to devices, and, in particular, to semiconductor memory devices with an adjustable diagnostic mechanism and methods for operating the same.

BACKGROUND

An apparatus (e.g., a processor, a memory system, and/or other electronic apparatus) can include one or more semiconductor circuits configured to store and/or process information. For example, the apparatus can include a memory device, such as a volatile memory device, a non-volatile memory device, or a combination device. Memory devices, such as dynamic random-access memory (DRAM), can utilize electrical energy to store and access data.

DETAILED DESCRIPTION

As described in greater detail below, the technology disclosed herein relates to an apparatus, such as for memory systems, systems with memory devices, related methods, etc., for dynamically adjusting diagnostics mechanisms (e.g., self-tests) during the lifetime of the apparatus. The apparatus can include a diagnostics mechanism, such as a memory built-in self-test (mBIST) mechanism (e.g., circuits, software instructions, firmware, or a combination thereof), configured to test and evaluate an internal storage circuit and/or operations regarding the same. For example, the mBIST mechanism can perform a sequence of reads and writes to a memory array according to a predetermined self-test sequence. The mBIST mechanism can store the test results at a designated location, such as a multiple input signature register (MISR), for subsequent access and/or evaluation.

The diagnostics mechanism can implement the self-test during the lifetime of the corresponding apparatus. As such, the diagnostics mechanism may implement the self-test across a variety of different conditions. The behavior or the expected outputs of the self-test may change, such as per error locations and/or temperature. Due to such variabilities, conventional devices may be configured to enable the MISR for select implementations of the self-test (e.g., the MISR is not always enabled), such that the test outputs are selectively monitored/evaluated for certain (e.g., not all) implementations of the self-test.

In contrast to the conventional devices, the apparatus can include an adjustable diagnostics mechanism that can adjust one or more aspects of a self-test process to account for the real-time conditions and the corresponding variabilities. For example, in some embodiments, the apparatus can include one or more indicators in the predetermined self-test sequence to identify portions that are susceptible to one or more environmental conditions. The adjustable diagnostics mechanism can suspend the test output storage (by, e.g., suspending the MISR) according to the indicators. As such, the adjustable diagnostics mechanism can eliminate or reduce the environment-based errors/issues associated with the self-test sequence. Accordingly, the apparatus can monitor and process the self-test output of increased number of test implementations. In some embodiments, the apparatus can be configured to monitor and process all self-test implementations, such as by always enabling the MISR.

Example Environment

Figure 1:
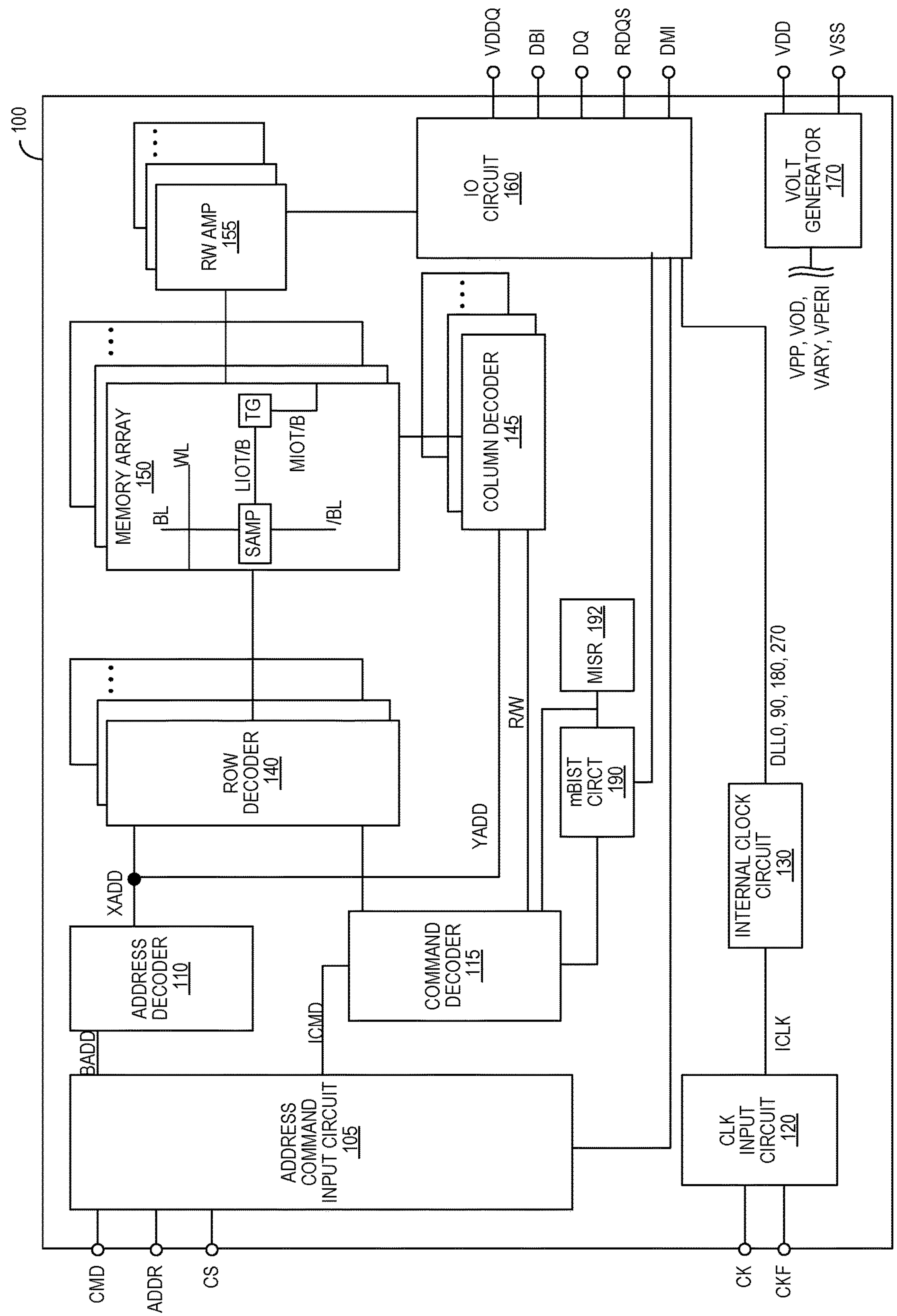
FIG. 1 is a block diagram of an apparatus in accordance with an embodiment of the present technology.

FIG. 1 is a block diagram of an apparatus 100 (e.g., a semiconductor die assembly, including a three-dimensional integration (3DI) device or a die-stacked package) in accordance with an embodiment of the present technology. For example, the apparatus 100 can include a DRAM or a portion thereof that includes one or more dies/chips.

The apparatus 100 may include an array of memory cells, such as memory array 150. The memory array 150 may include a plurality of banks (e.g., banks 0-15), and each bank may include a plurality of word-lines (WL), a plurality of bit lines (BL), and a plurality of memory cells arranged at intersections of the word-lines and the bit lines. Memory cells can include any one of a number of different memory media types, including capacitive, magnetoresistive, ferroelectric, phase change, or the like. The selection of a word-line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The sense amplifiers and transfer gates may be operated based on control signals from decoder circuitry, which may include the command decoder 115, the row decoders 140, the column decoders 145, any control circuitry of the memory array 150, or any combination thereof. The memory array 150 may also include plate lines and corresponding circuitry for managing their operation.

The apparatus 100 may employ a plurality of external terminals that include command and address terminals coupled to a command bus and an address bus to receive command signals (CMD) and address signals (ADDR), respectively. The apparatus 100 may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals VDD, VSS, and $V_{DDQ}$.

The command terminals and address terminals may be supplied with an address signal and a bank address signal (not shown in FIG. 1) from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal and supply the bank address signal to both the row decoder 140 and the column decoder 145.

The command and address terminals may be supplied with command signals (CMD), address signals (ADDR), and chip select signals (CS), from a memory controller and/or a nefarious chipset. The command signals may represent various memory commands from the memory controller (e.g., including access commands, which can include read commands and write commands). The chip select signal may be used to select the apparatus 100 to respond to commands and addresses provided to the command and address terminals. When an active chip select signal is provided to the apparatus 100, the commands and addresses can be decoded, and memory operations can be performed. The command signals may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word-line and a column command signal to select a bit line. The command decoder 115 may further include one or more registers for tracking various counts or values (e.g., counts of refresh commands received by the apparatus 100 or self-refresh operations performed by the apparatus 100).

Read data can be read from memory cells in the memory array 150 designated by row address (e.g., address provided with an active command) and column address (e.g., address provided with the read). The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the apparatus 100, for example, in a mode register (not shown in FIG. 1). The read latency information RL can be defined in terms of clock cycles of the CK clock signal. For example, the read latency information RL can be a number of clock cycles of the CK signal after the read command is received by the apparatus 100 when the associated read data is provided.

Write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160 and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the apparatus 100, for example, in the mode register. The write latency WL information can be defined in terms of clock cycles of the CK clock signal. For example, the write latency information WL can be a number of clock cycles of the CK signal after the write command is received by the apparatus 100 when the associated write data is received.

The power supply terminals may be supplied with power supply potentials $V_{DD}$ and $V_{SS}$. These power supply potentials $V_{DD}$ and $V_{SS}$ can be supplied to an internal voltage generator circuit 170. The internal voltage generator circuit 170 can generate various internal potentials $V_{pp}$, $V_{OD}$, $V_{ARY}$, $V_{PERI}$, and the like based on the power supply potentials $V_{DD}$ and $V_{SS}$. The internal potential $V_{pp}$ can be used in the row decoder 140, the internal potentials $V_{OD}$ and $V_{ARY}$ can be used in the sense amplifiers included in the memory array 150, and the internal potential $V_{PERI}$ can be used in many other circuit blocks.

The power supply terminal may also be supplied with power supply potential $V_{DDQ}$. The power supply potential $V_{DDQ}$ can be supplied to the input/output circuit 160 together with the power supply potential $V_{SS}$. The power supply potential $V_{DDQ}$ can be the same potential as the power supply potential $V_{SS}$ in an embodiment of the present technology. The power supply potential $V_{DDQ}$ can be a different potential from the power supply potential $V_{DD}$ in another embodiment of the present technology. However, the dedicated power supply potential $V_{DDQ}$ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a clock/enable signal from the command decoder 115, an input buffer can receive the clock/enable signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable (not shown in FIG. 1) from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as timing signals for determining output timing of read data and/or input timing of write data. The IO clock signals can be provided at multiple clock frequencies so that data can be output from and input to the apparatus 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The apparatus 100 can be connected to any one of a number of electronic devices capable of utilizing memory for the temporary or persistent storage of information, or a component thereof. For example, a host device of apparatus 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to apparatus 100; although in other embodiments, the host device may be indirectly connected to memory device (e.g., over a networked connection or through intermediary devices).

The apparatus 100 can an adjustable diagnostics mechanism self-test circuit, such as an mBIST circuit 190 and/or a MISR circuit 192. The mBIST circuit 190 can be configured to implement and/or control the self-test (e.g., the BIST) to evaluate a functional circuit (e.g., the memory array 150 and/or one or more other circuits described above) and a corresponding set of function. For example, the mBIST circuit 190 can be configured to perform a sequence of reads and writes from/to the memory array 150. The mBIST circuit 190 can store the test results at the MISR circuit 192. The MISR circuit 192 can be configured to collect the outputs of the mBIST test sequence (e.g., read results) and compact/process the collected outputs, such as by deriving a reduced signature or a pattern thereof.

During implementation of the self-test, the mBIST circuit 190 can control one or more operating states of the MISR circuit 192. For example, the mBIST circuit 190 can suspend the MISR circuit 192 at one or more points during the self-test. Accordingly, the mBIST circuit 190 can provide reliable test outputs regardless of the operating environment/conditions. The mBIST circuit 190 can thus enable the MISR circuit 192 for an increased number of or all implementations of the self-test. Details regarding the mBIST circuit 190 and the control of the MISR circuit 192 are described below.

Adjustment Control Circuit

Figure 2:
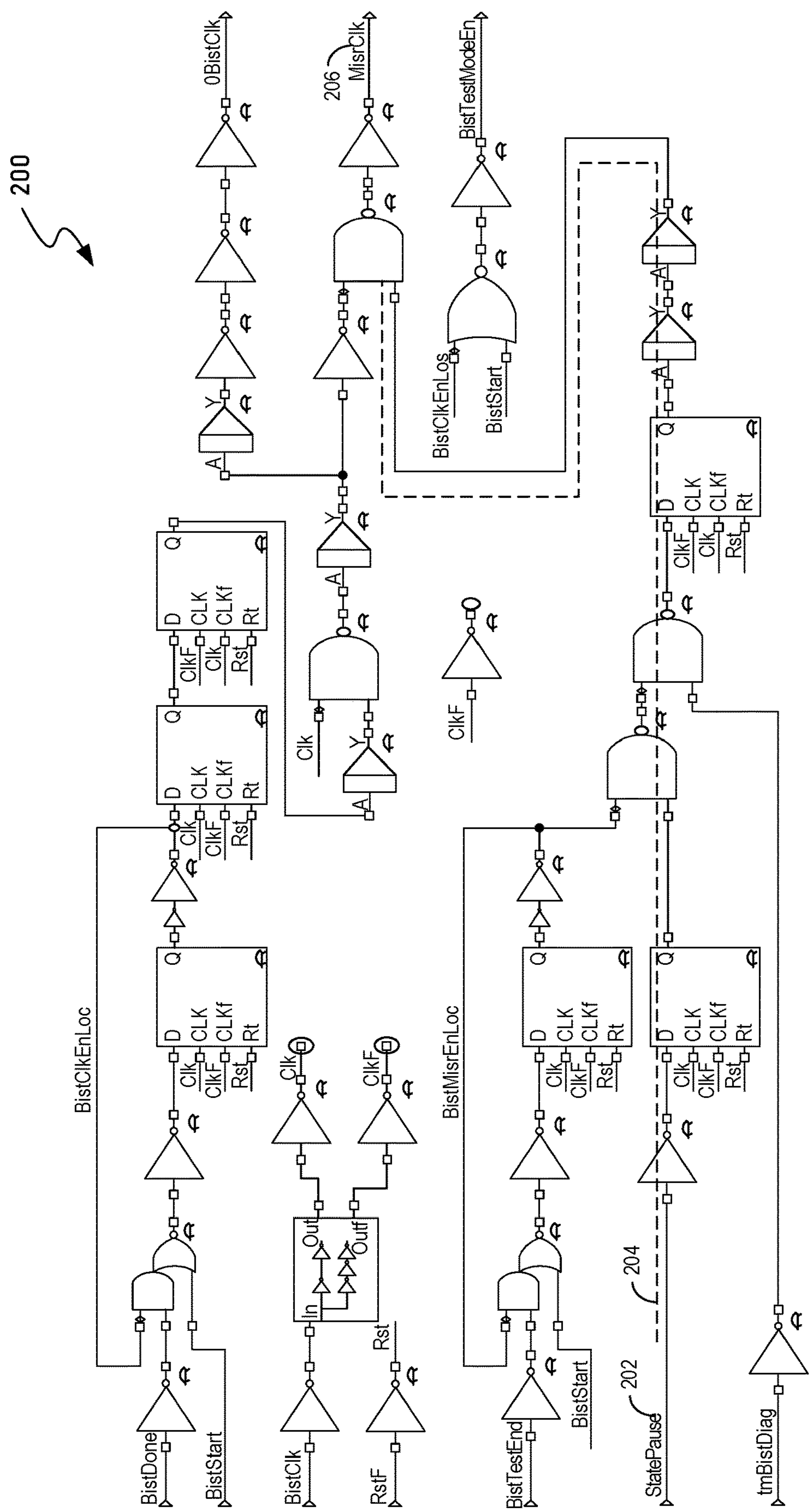
FIG. 2 is a schematic block diagram of an example adjustment circuit in accordance with an embodiment of the present technology.

FIG. 2 is a schematic block diagram of an example adjustment circuit 200 in accordance with an embodiment of the present technology. The adjustment circuit 200 can correspond to a control circuit configured to coordinate implementation/progression of the mBIST test and/or the operation of the MISR 190. In some embodiments, the adjustment circuit 200 can be implemented within the mBIST circuit 190, within the MISR circuit 192, or coupled between the mBIST circuit 190 and the MISR circuit 192.

The adjustment circuit 200 can include logic devices (e.g., buffers, NOT gates, delays, flip-flops, AND gates, OR gates, or a combination thereof) and circuits configured to control the implementation of the mBIST test. For example, the adjustment circuit 200 can receive input/status signals such as BistDone, BistStart, BistClk, RstF, BistTestEnd, BistStart, and/or tmrBistDiag to start, stop, and/or track progression of the mBIST test. The adjustment circuit 200 can generate a clock signal (e.g., 0BistClk) and/or an enable signal (e.g., BistTestModeEn) according to the input/status signals. The generated signals can control other portions of the apparatus 100 of FIG. 1 (e.g., the mBIST circuit 190) to implement the mBIST test according to a predetermined sequence.

The adjustment circuit 200 can further receive a pause signal 202 (e.g., StatePause) configured to adjust a status of the MISR circuit 192 during implementation of the mBIST test. The adjustment circuit 200 can include an adjustment control circuit 204 (e.g., components shown along a dashed line) configured to process the pause signal 202 and generate an output used to control the status of the MISR circuit 192. For the illustrated embodiment, the adjustment control circuit 204 can suspend a MISR clock signal 206 (e.g., MisrClk) when the pause signal 202 is activated.

In some embodiments, the predetermined sequence of the mBIST test can include the pause signal 202 at one or more portions therein, such as for portions that are expected to be affected by PVT factors. The adjustment circuit 200 can stop or suspend the MISR clock signal 206 when/while the pause signal 202 is active, thereby suspending the MISR operation during the corresponding portion(s) of the mBIST test.

Control Flow

Figure 3:
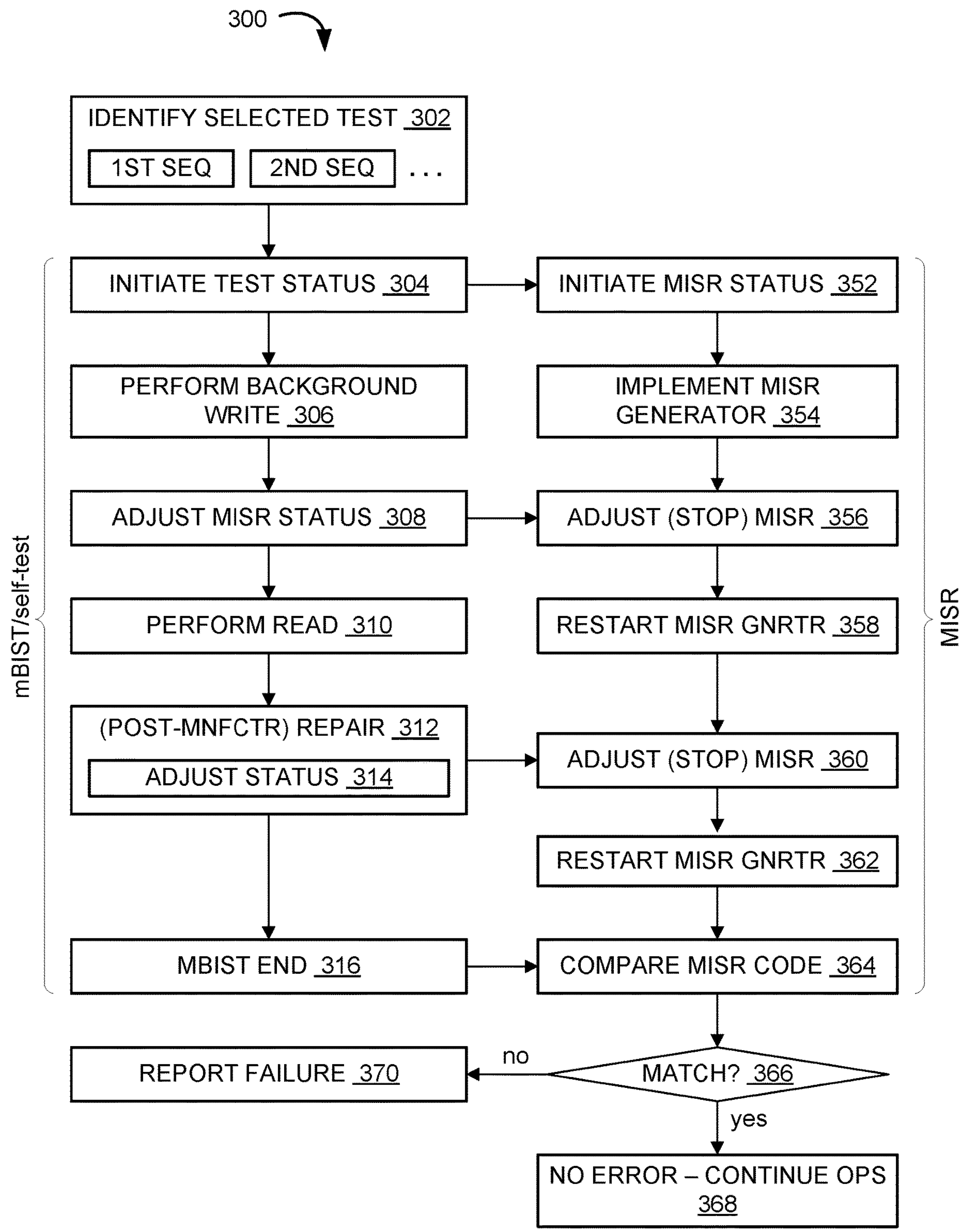
FIG. 3 is a flow diagram illustrating an example method of operating an apparatus in accordance with an embodiment of the present technology.

FIG. 3 is a flow diagram illustrating an example method 300 of operating an apparatus (e.g., the apparatus 100 of FIG. 1) in accordance with an embodiment of the present technology. The method 300 can be for operating the mBIST circuit 190 of FIG. 1, the MISR circuit 192 of FIG. 1, the mBIST test, the adjustment circuit 200 of FIG. 2, or a combination thereof. The method 300 can be for operating the apparatus 100 in an automotive environment/application.

In some embodiments, the apparatus can be configured to selectively implement one of multiple mBIST test sequences. The apparatus can be preloaded with multiple mBIST test sequences, such as for implementing the mBIST test with an error correction code (ECC) feature enabled or disabled. The apparatus can be configured, by a manufacturer or a user of the apparatus, to implement a selected mBIST test sequence during the lifetime of the apparatus. The apparatus may be configured to dynamically select a mBIST test sequence according to one or more real-time conditions, such as PVT parameters, error rates, amount of retired memory, operating time, or the like. At block 302, the apparatus can identify the selected test sequence. The apparatus can identify the selected test sequence based on reading a designated register, a hardware switch/connector setting, or the like. The apparatus can further access a MISR code (e.g., an expected test result) that corresponds to the selected test sequence.

At block 304, the apparatus (via, e.g., the mBIST circuit 190) can initiate the self-selected self-test and the corresponding mBIST test sequence. The apparatus can initiate the test sequence based on controlling one or more of the input signals to the adjustment circuit 200 as described above. In initiating the mBIST test sequence, the apparatus can initiate the MISR status/operations of the MISR circuit 192 in parallel, as illustrated in block 352. For example, the apparatus can initiate/toggle the MISR clock signal 206 of FIG. 2 and/or enable the MISR circuit 192 along with initiating the mBIST test sequence. The apparatus can enable the MISR circuit 192 whenever the mBIST circuit 190 implements the self-test and independent of an operating environment (e.g., the PVT parameters) of the apparatus. For example, the apparatus can use the MISR circuit 192 to log any/all implementations of the self-test and allow the selective suspension of the recording, as described below, to adjust for or address any errors or deviations that may be caused by the operating environment.

At block 306, the apparatus can perform background writes according to the test sequence. For example, the apparatus 100 can write predetermined data to one or more preset locations within the memory array 150 of FIG. 1 to test functionalities thereof.

In parallel, the apparatus can implement a MISR generator as illustrated at block 354. The MISR circuit 192 can be configured to collect the outputs of the self-test and compact/process the collected outputs, such as by deriving reduced signature of the outputs. The MISR circuit 192 can process/compress outputs from the self-test in parallel with subsequent portions of the self-test. The MISR circuit 192 can process the self-test outputs while the MISR clock signal 206 of FIG. 2 is active.

At block 308, the apparatus can adjust the MISR status during the implementation of the mBIST test sequence. For example, the apparatus can pause/suspend collection/compression of the MISR circuit 192 according to one or more activations of the pause signal 202 of FIG. 2. The apparatus can use the adjustment control circuit 204 to stop/suspend the MISR clock signal 206 of FIG. 2 supplied to the MISR circuit 192. Accordingly, the apparatus can deactivate the MISR circuit 192 during the one or more portions of the self-test that are predicted to be affected by one or more operating environment parameters corresponding to process, voltage, and temperature (PVT). In response the MISR circuit 192 can adjust or suspend/stop the operations thereof as illustrated at block 356. The MISR circuit 192 can ignore any self-test results that are generated during the suspended state.

At block 310, the apparatus can perform a set of reads at the one or more preset locations. The apparatus can effectively read back the predetermined data that were written as illustrated at block 306.

During a subsequent portion of the background write, at an end of the background write, and/or at a start of or during the read operation, the apparatus can restart the MISR circuit 192 as illustrated at block 358. In some embodiments, the apparatus can restart the operations of the MISR circuit 192 after a predetermined duration, such as when the pause signal 202 is deactivated. In response to the deactivation of the pause signal 202, the adjustment control circuit 204 can reinitiate toggling of the MISR clock signal 206, which can restart the operations of the MISR circuit 192.

At block 312, the apparatus can implement repair operations, such as post-production repair (PPR) operations, according to the test sequence. The apparatus can repair failing memory locations (e.g., locations having readback results not matching the known written data), such as by swapping the failing locations with spare memory.

At block 314, the apparatus (e.g., the mBIST 190) can adjust the MISR status at the beginning of or during the implementation of the repair operations. At block 360, the apparatus can adjust the MISR operating status in response to the adjusted status. The apparatus can adjust, such as by stopping or suspending, the operating status of the MISR circuit 192 as illustrated at block 360 and as described above. At block 362, the apparatus can restart the MISR generator as described above.

At block 316, the apparatus can end the self-test or the corresponding mBIST sequence. At the end of the mBIST sequence, the apparatus can end or complete self-test operations at the MISR circuit 192 and output the MISR code (e.g., the compressed data in the MISR circuit 192 resulting from the corresponding generator). At block 364, the apparatus can compare the MISR code (e.g., the reduced signature of the readback data) to the expected code (e.g., the expected results corresponding to the selected test sequence).

At decision block 366, the apparatus can determine whether the resulting MISR code matches the expected code. When the MISR code matches the expected code, the apparatus can continue operations without any additional adjustments as illustrated at block 368. When the MISR code fails to match the expected code, the apparatus can report a failure status to a user, such as a driver and/or an automobile manufacturer in automotive applications.

Figure 4:
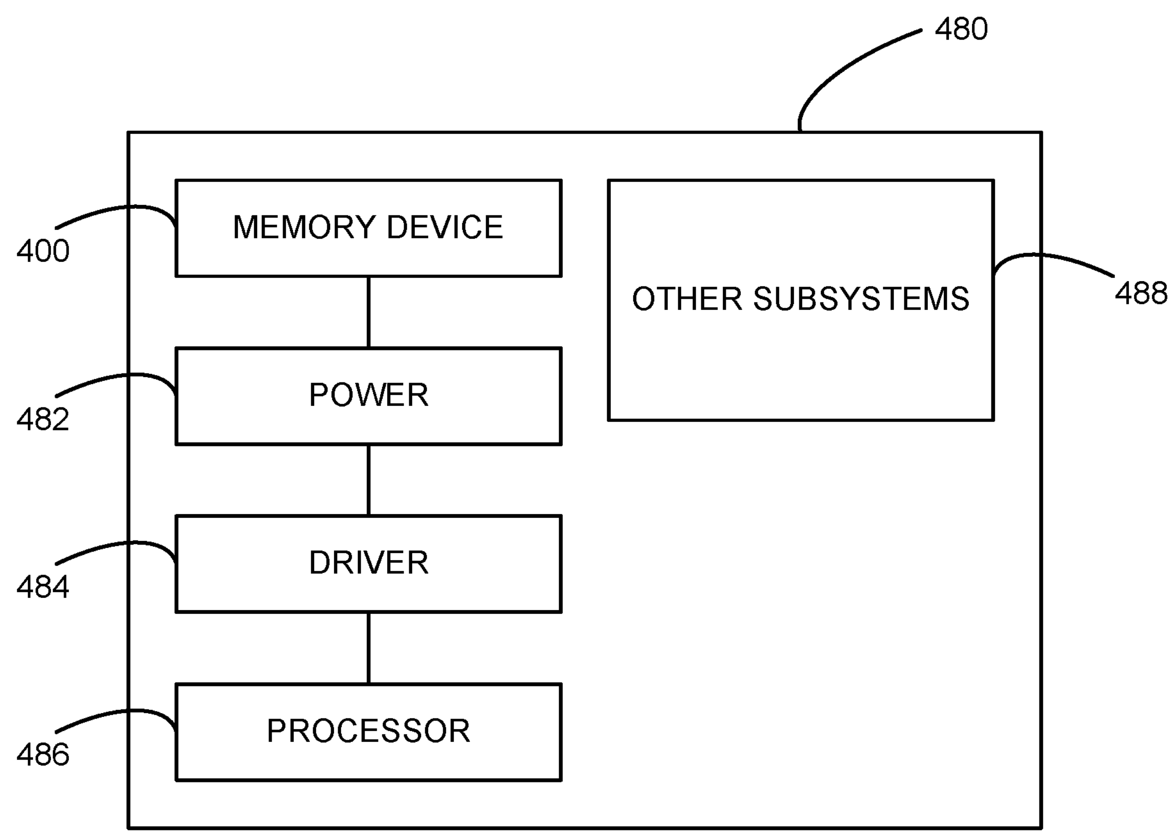
FIG. 4 is a schematic view of a system that includes an apparatus in accordance with an embodiment of the present technology.

FIG. 4 is a schematic view of a system that includes an apparatus in accordance with embodiments of the present technology. Any one of the foregoing apparatuses (e.g., memory devices) described above with reference to FIGS. 1-3 can be incorporated into any of a myriad of larger and/or more complex systems, a representative example of which is system 480 shown schematically in FIG. 4. The system 480 can include a memory device 400, a power source 482, a driver 484, a processor 486, and/or other subsystems or components 488. The memory device 400 can include features generally similar to those of the apparatus described above with reference to FIGS. 1-3, and can therefore include various features for performing a direct read request from a host device. The resulting system 480 can perform any of a wide variety of functions, such as memory storage, data processing, and/or other suitable functions. Accordingly, representative systems 480 can include, without limitation, hand-held devices (e.g., mobile phones, tablets, digital readers, and digital audio players), computers, vehicles, appliances and other products. Components of the system 480 may be housed in a single unit or distributed over multiple, interconnected units (e.g., through a communications network). The components of the system 480 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structure includes information arranged as bits, words or code-words, blocks, files, input data, system-generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-4.

We claim:

1. An apparatus, comprising:

a functional circuit configured to provide a set of functions;

a register circuit configured to collect a set of self-test results; and a built-in self-test (BIST) circuit coupled to the functional circuit and the register circuit, the BIST circuit configured to implement a self-test using the functional circuit and generate the set of self-test results, wherein the self-test corresponds to performing the set of functions according to a predetermined sequence and a predetermined input set, and wherein implementing the self-test includes deactivating the register circuit during one or more portions of the self-test to suspend collection of self-test outputs during the one or more portions.

2. The apparatus of claim 1, wherein:

the functional circuit includes a memory array configured to store data and provide access to the stored data;

the BIST circuit is a memory BIST (mBIST) circuit;

the self-test corresponds to (1) writing predetermined data and (2) reading the written data using one or more known locations in the memory array to test functionalities of the memory array; and the register circuit is a multiple input signature register (MISR) circuit configured to collect results of reading the predetermined data from the one or more known locations.

3. The apparatus of claim 2, wherein:

the MISR circuit is configured to derive a reduced signature or a pattern for the collected set of results; and the mBIST circuit is configured to deactivate the derivation for the reduced signature during the one or more portions of the self-test.

4. The apparatus of claim 3, wherein:

the self-test includes (1) performing a sequence of background writes at the memory array, (2) reading from the memory array, and/or (3) implementing repair operations for adjusting the memory array; and the mBIST circuit is configured to deactivate and restart the derivation at the MISR circuit (1) during or at an end of performing the sequence of writes and/or (2) during or at an end of implementing the repair operations.

5. The apparatus of claim 3, wherein the mBIST circuit is configured to deactivate the MISR circuit during the one or more portions of the self-test that are predicted to be affected by one or more operating environment parameters corresponding to process, voltage, and temperature (PVT).

6. The apparatus of claim 3, wherein the mBIST circuit and/or the MISR circuit is further configured to:

compare the reduced signature for the collected read results to an expected signature; and selectively report a failure status for the apparatus when the reduced signature fails to match the expected signature.

7. The apparatus of claim 6, wherein the mBIST circuit and/or the MISR circuit is further configured to:

identify the self-test that has been selected from a set of available tests each having a unique result signature; and compare the reduced signature to the expected signature that corresponds to the selected self-test.

8. The apparatus of claim 7, wherein the set of available tests includes sequences and results corresponding to (1) enabling error correction code (ECC) or (2) disabling the ECC during the self-test.

9. The apparatus of claim 3, wherein the MISR circuit is enabled whenever the mBIST circuit implements the self-test and independent of an operating environment of the apparatus based on the deactivation control of the mBIST circuit.

10. The apparatus of claim 1, wherein:

the register circuit is configured to process outputs from the self-test in parallel with subsequent portions of the self-test, wherein the outputs are processed according to a clock signal supplied by the BIST circuit;

the predetermined input set for the self-test includes one or more activations of a pause signal at the one or more portions of the self-test; and the BIST circuit includes an adjustment control circuit configured to deactivate the register circuit by suspending the clock signal supplied to the register circuit in response to the one or more activations of the pause signal.

11. A method of operating an apparatus that includes a functional circuit configured to provide a set of functions, the method comprising:

initiating self-test of the functional circuit using a built-in self-test (BIST) circuit coupled to the functional circuit, wherein the self-test corresponds to performing the set of functions according to a predetermined sequence and a predetermined input set;

at a register circuit, collecting a set of results generated by and during the self-test; and deactivating the register circuit during one or more portions of the self-test to suspend collection of self-test outputs during the one or more portions.

12. The method of claim 11, wherein:

the functional circuit includes a memory array configured to store data and provide access to the stored data;

the register circuit is a multiple input signature register (MISR) circuit;

the method further comprising:

at the register circuit, deriving a reduced signature for the collected read results;

implementing the self-test based on (1) writing predetermined data and (2) reading the written data using one or more known locations in the memory array to test functionalities of the memory array;

comparing the reduced signature for the collected read results to an expected signature; and selectively report a failure status for the apparatus when the reduced signature fails to match the expected signature.

13. The method of claim 12, further comprising:

identifying the self-test that has been selected from a set of available tests each having a unique result signature; and comparing the reduced signature to the expected signature that corresponds to the selected self-test.

14. The method of claim 11, further comprising:

implementing the self-test based on (1) performing a sequence of background writes at the functional circuit, (2) reading from the functional circuit, and (3) implementing repair operations for adjusting the functional circuit; and wherein:

deactivating the register circuit during the one or more portions of the self-test includes deactivating and then restarting derivation of a reduced signature for the collected set of results (1) during or at an end of performing the sequence of writes and/or (2) during or at an end of implementing the repair operations.

15. The method of claim 11, wherein deactivating the register circuit includes suspending collection of the self-test outputs during the one or more portions of the self-test that are predicted to be affected by one or more operating environment parameters corresponding to process, voltage, and temperature (PVT).

16. A memory device, comprising:

a memory array including memory cells configured to store data and provide access to the stored data;

a multiple input signature register (MISR) circuit configured to collect and process a set of self-test results; and a memory built-in self-test (mBIST) circuit coupled to the MISR circuit and the memory array, the BIST circuit configured to implement a self-test for the memory and generate the set of self-test results, wherein the self-test corresponds to (1) writing predetermined data and (2) reading the written data using one or more known locations in the memory array to test functionalities of the memory array, and wherein implementing the self-test includes deactivating the MISR circuit during one or more portions of the self-test to suspend collection and/or processing of self-test outputs self-test outputs during the one or more portions.

17. The memory device of claim 16, wherein:

the MISR circuit is configured to process outputs from the self-test in parallel with subsequent portions of the self-test, wherein the outputs are processed according to a clock signal supplied by the mBIST circuit;

the predetermined input set for the self-test includes one or more activations of a pause signal at or during the one or more portions of the self-test; and the mBIST circuit includes an adjustment circuit configured to deactivate the MISR circuit by suspending the clock signal supplied to the MISR circuit in response to the one or more activations of the pause signal.

18. The memory device of claim 17, wherein:

the self-test includes (1) performing a sequence of background writes at the memory array, (2) reading from the memory array, and/or (3) implementing repair operations for adjusting the memory array; and the mBIST circuit is configured to deactivate and restart the derivation at the MISR circuit (1) during or at an end of performing the sequence of writes and/or (2) during or at an end of implementing the repair operations.

19. The memory device of claim 17, wherein the mBIST circuit and/or the MISR circuit is further configured to:

identify the self-test that has been selected from a set of available tests each having a unique result signature, wherein the set of available tests includes sequences and results corresponding to (1) enabling error correction code (ECC) or (2) disabling the ECC during the self-test; and compare the reduced signature to the expected signature that corresponds to the selected self-test; and selectively report a failure status for the apparatus when the reduced signature fails to match the expected signature.

20. The memory device of claim 17, wherein the memory device comprises a dynamic random-access memory (DRAM) configured for automotive applications.

* * * * *